United States Patent
Hayashi et al.

(10) Patent No.: US 8,920,598 B2
(45) Date of Patent: Dec. 30, 2014

(54) ELECTRODE AND PLASMA PROCESSING APPARATUS

(75) Inventors: Daisuke Hayashi, Yamanashi (JP);
Shoichiro Matsuyama, Yamanashi (JP);
Koichi Murakami, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 268 days.

(21) Appl. No.: 13/046,900

(22) Filed: Mar. 14, 2011

(65) Prior Publication Data

US 2011/0226420 A1 Sep. 22, 2011

Related U.S. Application Data

(60) Provisional application No. 61/323,051, filed on Apr. 12, 2010.

(30) Foreign Application Priority Data

Mar. 16, 2010 (JP) ................................ 2010-059485

(51) Int. Cl.
| | |
|---|---|
| C23C 16/00 | (2006.01) |
| C23F 1/00 | (2006.01) |
| H01L 21/306 | (2006.01) |
| H01J 37/32 | (2006.01) |

(52) U.S. Cl.
CPC ....... *H01J 37/3266* (2013.01); *H01J 37/32541* (2013.01); *H01J 37/32091* (2013.01)
USPC .............. 156/345.47; 118/723 E; 156/345.43

(58) Field of Classification Search
USPC ............. 118/715, 728–730; 156/134, 345.33, 156/345.34, 345.51–345.55; 361/234; 315/111.21

See application file for complete search history.

(56) References Cited

U.S. PATENT DOCUMENTS

| | | | |
|---|---|---|---|
| 6,774,570 B2 * | 8/2004 | Tsuchiya et al. | 315/111.21 |
| 7,469,654 B2 * | 12/2008 | Ishibashi et al. | 118/723 MW |
| 2004/0261712 A1 * | 12/2004 | Hayashi et al. | 118/723 E |
| 2007/0169890 A1 * | 7/2007 | Shishido et al. | 156/345.29 |
| 2009/0025632 A1 * | 1/2009 | Buechel et al. | 118/50.1 |

FOREIGN PATENT DOCUMENTS

| | | |
|---|---|---|
| JP | 2000-323456 A | 11/2000 |
| JP | 2002-176033 A | 6/2002 |
| JP | 2003-506889 A | 2/2003 |
| JP | 2005-228973 A | 8/2005 |
| JP | 2006-339678 A | 12/2006 |
| JP | 2008-047869 A | 2/2008 |

* cited by examiner

*Primary Examiner* — Rakesh Dhingra
(74) *Attorney, Agent, or Firm* — Pearne & Gordon LLP

(57) ABSTRACT

There is provided a plasma processing apparatus including a processing chamber 100 configured to perform a plasma process on a wafer W; an upper electrode 105 and a lower electrode 110 arranged to face each other in the processing chamber 100 and configured to form a processing space therebetween; and a high frequency power supply 150 connected with at least one of the upper electrode 105 and the lower electrode 110 and configured to output a high frequency power into the processing chamber 100. The upper electrode 105 includes an upper base 105*a* made of a dielectric material, and a plurality of fine holes A having a diameter equal to or less than twice a thickness of a sheath are formed in the upper base 105*a*.

10 Claims, 7 Drawing Sheets

--Prior Art--

ELECTRODE AND PLASMA PROCESSING APPARATUS

CROSS-REFERENCE TO RELATED APPLICATION

This application claims the benefit of Japanese Patent Application No. 2010-059485 filed on Mar. 16, 2010 and U.S. Provisional Application Ser. No. 61/323,051 filed on Apr. 12, 2010, the entire disclosures of which are incorporated herein by reference.

FIELD OF THE INVENTION

The present disclosure relates to a structure of an electrode used in a plasma processing apparatus and a plasma processing apparatus using this electrode. To be more specific, the present disclosure relates to a structure of an electrode used in a plasma processing apparatus for controlling an intensity distribution of a high frequency electric field used for generating plasma and a plasma processing apparatus using this electrode.

BACKGROUND OF THE INVENTION

Recently, as miniaturization is increasingly demanded, a relatively high frequency power needs to be supplied to generate high density plasma. As depicted in FIG. 6, as a frequency of a power supplied from a high frequency power supply 150 becomes higher, a high frequency current flows along a surface of a lower electrode 110 and particularly, along a top surface of the lower electrode 110 from an edge area of the lower electrode 110 toward a central area thereof by a skin effect. Accordingly, electric field intensity at the central area of the lower electrode 110 becomes higher than electric field intensity at the edge area of the lower electrode 110, so that ionization or dissociation of a gas is accelerated at the central area of the lower electrode 110 as compared to the edge area thereof. Consequently, electron density of plasma at the central area of the lower electrode 110 becomes higher than electron density of plasma at the edge area thereof. At the central area of the lower electrode 110 where the electron density of plasma is high, resistivity of plasma becomes low, and, thus, the high frequency current is concentrated at a central area of an upper electrode 105 facing the lower electrode 110 and plasma density becomes more non-uniform.

In order to improve uniformity in plasma, it has been suggested to embed a rectangular-shaped flat dielectric member in a lower center of a conductor of an electrode (for example, see Patent Document 1). In Patent Document 1, an intensity distribution of an electric field is decreased under the dielectric member by action of the dielectric member, so that plasma density at the lower center of the electrode becomes decreased and uniformity in the plasma density can be improved.

In order to further improve uniformity in plasma, it has been suggested to form a dielectric member embedded in a conductor of an electrode into a taper shape (for example, see Patent Document 2). In Patent Document 2, since the dielectric member is formed into a taper shape, an intensity distribution of an electric field at an edge area of the dielectric member is not too much decreased as compared to a case in which the dielectric member is flat. Accordingly, uniformity in plasma density can be further improved.

Patent Document 1: Japanese Patent Laid-open Publication No. 2000-323456
Patent Document 2: Japanese Patent Laid-open Publication No. 2005-228973

However, in order to embed the dielectric member in the conductor, a method of connecting different kinds of materials is needed. Particularly, in order to embed the taper-shaped dielectric member in the conductor, a large-scale taper structure needs to be manufactured. By way of example, the conductor and the dielectric member may be connected to each other by an adhesive or a screw. Further, the conductor may be made of metal such as aluminum or the like and the dielectric member may be made of ceramic or the like, and, thus, a linear thermal expansion coefficient is different. Therefore, an appropriate gap may need to be formed at a connecting area between the conductor and the dielectric member. However, if the dielectric member is formed into a taper shape, it is difficult to perform a machining process thereto and a dimensional accuracy at a tapered area becomes deteriorated. Accordingly, a stress may be concentrated on a part of the connecting area due to a difference in a linear thermal expansion coefficient, and, thus, the adhesive on a connecting surface may be peeled off and may become a contaminant within a chamber.

If an attempt to change a profile for an effect of a plasma process is made, since the dielectric member is embedded in the conductor, a broad scale design needs to be changed. Even if the effect of the plasma process is slightly changed by making a partial change of the design, a manufacturing process is still difficult. Therefore, in order to overcome the above-described problems, it is necessary to manufacture an electrode capable of controlling an intensity distribution of an electric field by using a single material or a material to be integrated.

In order to solve the above-described problems, the present disclosure provides a novel and advanced electrode and a plasma processing apparatus capable of controlling an intensity distribution of an electric field of a high frequency power used for generating plasma by using the electrode made of a homogeneous material.

BRIEF SUMMARY OF THE INVENTION

In accordance with one aspect of the present disclosure, there is provided an electrode of a plasma processing apparatus that introduces a processing gas into a depressurizable processing chamber, generates plasma by a high frequency power, and performs a plasma process on a processing target object by the plasma. The electrode includes a base made of a dielectric material. Here, a plurality of fine holes having a diameter equal to or less than twice a thickness of a sheath are formed in the base.

In accordance with this structure, since a vacuum space is regarded as a dielectric layer having a dielectric constant $\in_0$ of about "1", there is made a difference between a dielectric constant $\in$ of the base and the dielectric constant $\in_0$ of the vacuum space within a fine hole. Here, the dielectric constant $\in_0$ of the vacuum space is about "1", i.e., a lowest value among dielectric constants of dielectric materials. Therefore, the dielectric constant $\in_0$ within the fine hole is surely lower than the dielectric constant $\in$ of the base. Accordingly, a capacitance (electrostatic capacitance) within the fine hole is surely lower than a capacitance of the base. In terms of an electrostatic capacitance, by way of example, an area where the fine holes A are formed as depicted in the left of FIG. 4 has an effect equal to a case in which a dielectric member serving as the base becomes thick as depicted in the right of FIG. 4 as a protruding area 105a1.

Based on this principle, in the present disclosure, by forming the multiple number of fine holes at the central area of the base serving as the electrode, an electrostatic capacitance at the central area of the base is reduced to be lower than an electrostatic capacitance at a periphery thereof. Accordingly, it is possible to achieve an effect equal to a case in which the dielectric member serving as the base becomes thicker at the central area than the periphery thereof. That is, it is more difficult for a high frequency power to escape from the fine holes of the base than to escape from other areas. Consequently, in the present disclosure, by using the electrode made of only a homogeneous material (i.e. the base having the dielectric constant ∈), plasma density at the central area of the base can be reduced, so that an intensity distribution of an electric field of a high frequency power used for generating plasma can be uniform (hereinafter, referred to as uniformization effect due to an upper electrode).

Conventionally, by embedding the different member having a lower dielectric constant than that of the conductor in the central area of the conductor, plasma density at the central area of the conductor was reduced and a distribution of the plasma density became uniform. However, as described above, there is no material having a lower dielectric constant than that of a vacuum. For this reason, if a fine hole having a vacuum state therein is used in accordance with the present disclosure, a difference in a dielectric constant between the base and the file hole can be increased as compared to a case in which any other dielectric member is inserted into the base, and it is possible to achieve the uniformization effect due to an upper electrode.

Further, in the present disclosure, there is no need to connect the conductor with the dielectric member, and, thus, a certain material or a certain adhesive is not needed. Besides, with respect to a plate-shaped member, the fine holes are formed at an area thereof where the uniformization effect due to an upper electrode is required, and, thus, it becomes easy and simple to manufacture the plate-shaped member and there is no need to redesign a whole ceiling plate. Since the fine holes having a hollow region therein are just formed in the base, the adhesive does not peeled off and comes out to the processing chamber. For this reason, the present disclosure has an excellent effect due to the upper electrode, which is effective particularly with respect to a ceiling plate which is made of only a high purity material because of strict demands for a process against metal contamination.

The diameter of the fine hole is equal to or less than twice the thickness of the sheath. For this reason, an inner space of the fine hole may become a sheath region. Consequently, it is possible to avoid a generation of abnormal electric discharge within the fine hole and possible to prevent plasma from being introduced into the fine hole.

The plurality of fine holes may not penetrate the base from the top to the bottom thereof.

The plurality of fine holes may communicate with the processing chamber, and if an inside of the processing chamber is in a vacuum state, the plurality of fine holes may be in a vacuum state accordingly.

Depths of the plurality of fine holes may be varied such that the plurality of fine holes do not penetrate the base from the top to the bottom on the side of a plasma generation space.

A depth of the fine hole formed at an edge area of the base may be shallower than a depth of the fine hole formed at a central area of the base.

The plurality of fine holes may be formed into a taper shape when viewed as whole.

The plurality of fine holes may be formed to have various diameters within a range of twice the thickness of the sheath.

A diameter of the fine hole formed at an edge area of the base may be smaller than a diameter of the fine hole formed at a central area of the base.

The plurality of fine holes may be uniformly provided.

In accordance with another aspect of the present disclosure, there is provided a plasma processing apparatus including a processing chamber configured to perform a plasma process on a processing target object; first and second electrodes arranged to face each other in the processing chamber and configured to form a processing space therebetween; and a high frequency power supply connected with at least one of the first and second electrodes and configured to output a high frequency power into the processing chamber. Here, the first electrode includes a base made of a dielectric material, and a plurality of fine holes having a diameter equal to or less than twice a thickness of a sheath are formed in the base.

The first electrode may be an upper electrode, and the upper electrode may be provided with a plurality of gas inlet lines and serves as a shower head.

The second electrode may be a lower electrode, and the high frequency power supply may be configured to supply the high frequency power to the lower electrode.

As described above, in accordance with the present disclosure, it is possible to control an intensity distribution of a high frequency electric field used for generating plasma by using an electrode made of a homogeneous material.

DETAILED DESCRIPTION OF THE INVENTION

Figure 1:
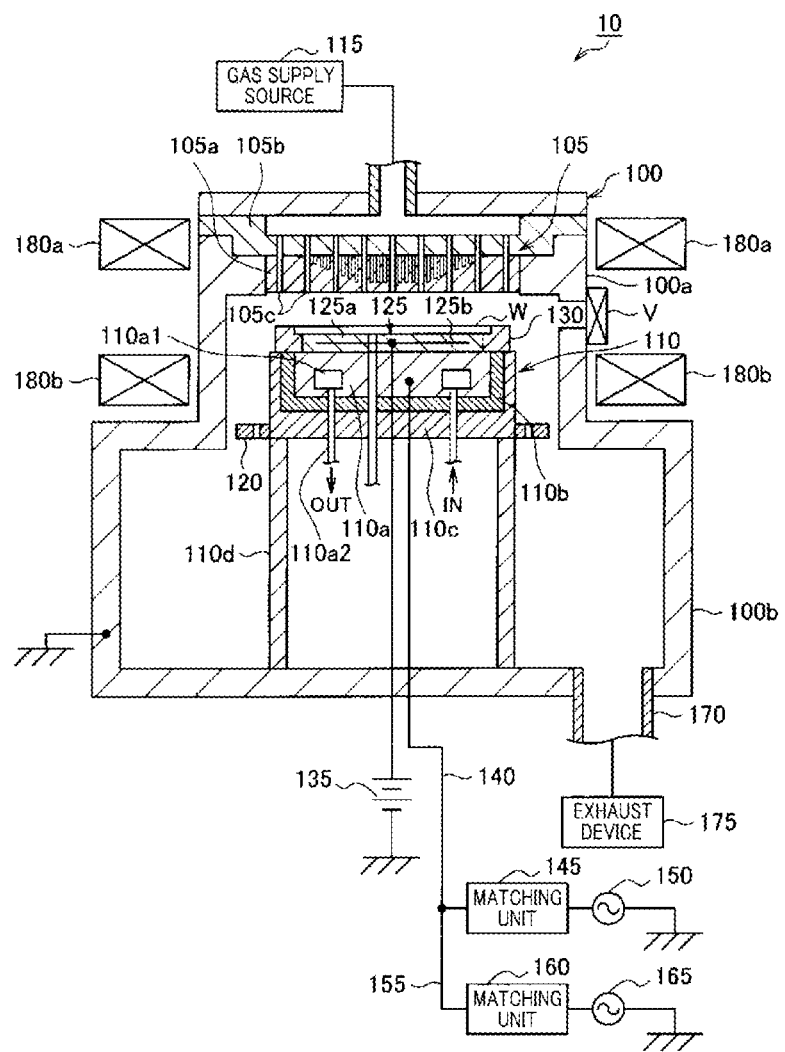
FIG. 1 is a longitudinal cross sectional view of a RIE plasma etching apparatus in accordance with an embodiment of the present disclosure.

Hereinafter, embodiments of the present disclosure will be described in detail with reference to the accompanying drawings. Through the present specification and drawings, parts having substantially same function and configuration will be assigned same reference numerals, and redundant description will be omitted.

An RIE plasma etching apparatus (parallel plate type plasma processing apparatus) using an electrode in accordance with an embodiment of the present disclosure will be explained with reference to FIG. 1. An RIE plasma etching apparatus 10 is an example of a plasma processing apparatus that introduces a processing gas into a depressurizable processing chamber, generates plasma by a high frequency power and performs a plasma process on a processing target object by the plasma.

The RIE plasma etching apparatus 10 may include a depressurizable processing chamber 100. The processing chamber 100 may include an upper chamber 100a of a small diameter and a lower chamber 100b of a large diameter. The processing chamber 100 may be made of metal such as aluminum and be grounded.

Within the processing chamber 100, an upper electrode 105 and a lower electrode 110 may be positioned to face each other, so that a pair of parallel plate type electrodes may be provided. A wafer W may be loaded into the processing chamber 100 through a gate valve V and mounted on the lower electrode 110. A processing gas is introduced into the processing chamber 100 and plasma is generated by a high frequency power. The wafer W on the lower electrode 110 is etched by the plasma.

The upper electrode 105 may include an upper base 105a and a base plate 105b on the upper base 105a. The upper base 105a may be made of quartz. The upper base 105a may be made of, but not limited to, quartz ($SiO_2$), a dielectric material such as alumina ($Al_2O_3$), silicon nitride ($Si_3N_4$), aluminum nitride (AlN), yttria ($Y_2O_3$) or Teflon (registered trademark: polytetrafluoroethylene).

The processing gas may be supplied from a gas supply source 115 and diffused in a diffusion space formed by the base plate 105b made of a conductive material and the processing chamber 100. Then, as depicted in a longitudinal cross sectional view of the upper electrode 105 in FIG. 2B, the gas is introduced into the processing chamber 100 through a multiple number of gas openings 105c via a multiple number of gas inlet lines 105e provided in the upper base 105a and a multiple number of gas passages 105d. The upper electrode 105 may serve as a shower head including the upper base 105a and the base plate 105b as one body. Alternatively, the upper electrode 105 may not include the base plate 105b, and instead, the upper base 105a may be directly connected to a ceiling plate of the processing chamber 100.

A multiple number of fine holes A may be formed at an upper central area of the upper base 105a. The fine holes A formed at the central area of the upper base 105a may have the same depth. Further, the fine holes A formed at a periphery of the upper substrate 105a may have a depth shallower than that of the fine holes A formed at the central area of the upper base 105a. Thus, the multiple number of fine holes A may be formed to have a taper shape, when viewed as whole.

Figure 2B:
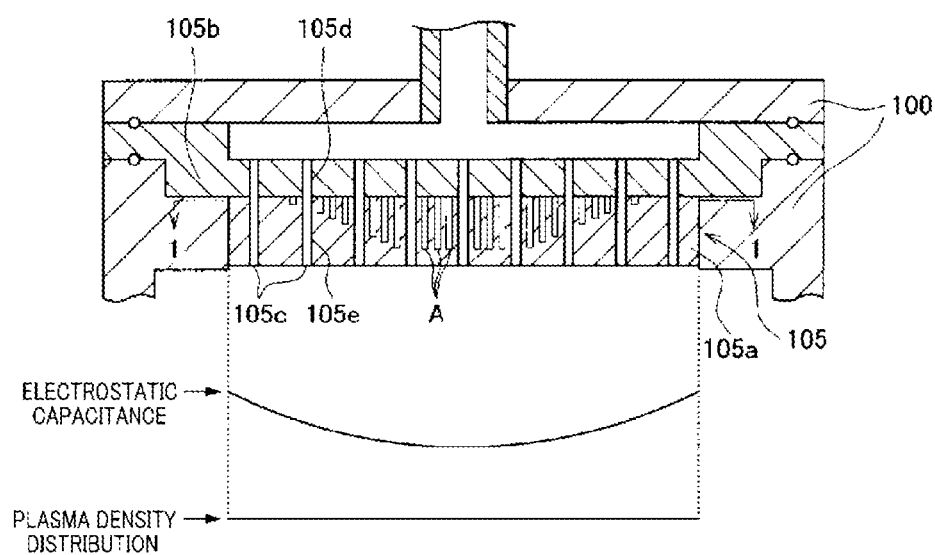
Figure 3:
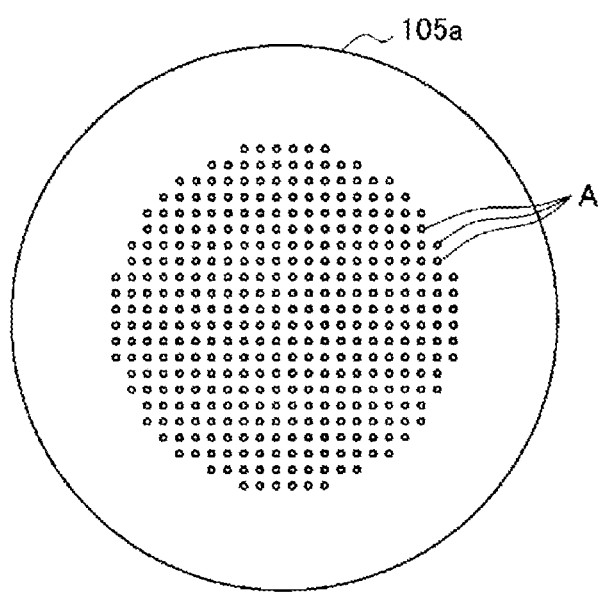
FIG. 3 is a transversal cross sectional view (i.e. a cross sectional view taken along a line 1-1 of FIG. 2B) of a base of an electrode in accordance with the embodiment of the present disclosure.

FIG. 3 is a transversal cross sectional view (i.e. across sectional view taken along a line 1-1 of FIG. 2B) of the upper base 105a of the upper electrode 105 in accordance with the present embodiment. The fine holes may be uniformly provided at the central area of the upper base 105a. A function and an effect of the fine holes A will be described later.

A pattern of the fine holes may be, but not limited to, a substantially square and may be any pattern having uniformity within the surface, such as a substantially equilateral triangular or a substantially circular. Instead of the fine holes A, one or more ring-shaped grooves may be formed concentrically.

The lower electrode 110 may include a lower base 110a made of metal such as aluminum and the lower base 110a is supported by a supporting table 110c via an insulating layer 110b. Thus, the lower electrode 110 may be in an electrically floating state. A lower portion of the supporting table 110c may be covered with a cover 110d. A baffle plate 120 may be installed at a lower outer periphery of the supporting table 110c so as to control a flow of a gas.

A coolant reservoir 110a1 may be provided in the lower electrode 110, so that a coolant is introduced through a coolant inlet pipe 110a2 in a direction as indicated by an arrow IN and circulated in the coolant reservoir 110a1, and then discharged through the coolant inlet pipe 110a2 in a direction as indicated by an arrow OUT. Thus, the lower electrode 110 may be controlled to have a predetermined temperature.

In an electrostatic chuck 125 on the lower electrode 110, a metal sheet member (electrode member) 125b may be embedded in an insulating member 125a. The electrode member 125b may be connected with a DC power supply 135, and DC voltage output from the DC power supply 135 may be applied to the electrode member 125b, so that the wafer W may be electrostatically attracted to the lower electrode 110. A focus ring 130 made of, for example, silicon may be installed at an outer periphery of the electrostatic chuck 125 in order to maintain uniformity of plasma.

The lower electrode 110 may be connected with a first matching unit 145 and a first high frequency power supply 150 via a first power supply rod 140. The gas within the processing chamber 100 may be excited into plasma by electric field energy of a high frequency power for plasma excitation output from the first high frequency power supply 150. By the electric discharge plasma generated in this way, an etching process may be performed on the wafer W. In the present embodiment, although the upper electrode 105 is referred to as a first electrode and the lower electrode 110 is referred to as a second electrode, the first electrode may be any one of the upper electrode 105 and the lower electrode 110 and the second electrode may be any one of the upper electrode 105 and the lower electrode 110.

The lower electrode 110 may be connected with a second matching unit 160 and a second high frequency power supply 165 via a second power supply rod 155 branched from the first power supply rod 140. A high frequency power of, for example, about 3.2 MHz output from the second high frequency power supply 165 may be used as bias voltage to attract ions toward the lower electrode 110.

An exhaust port 170 may be provided at a bottom surface of the processing chamber 100, and the inside of the processing chamber 100 may be maintained in a predetermined vacuum state by driving an exhaust device 175 connected with the exhaust port 170.

Multi-pole ring magnets 180a and 180b may be arranged around the upper chamber 100a. The multi-pole ring magnets 180a and 180b may be provided such that a multiple number of columnar anisotropic segment magnets may be installed in a ring-shaped magnetic casing and magnetic poles of the adjacent columnar anisotropic segment magnets are alternately reversed. Thus, magnetic force lines may be formed between the adjacent segment magnets and a magnetic field may be formed only at a peripheral area of a processing space between the upper electrode 105 and the lower electrode 110, so that plasma may be confined in the processing space.

Figure 2A:
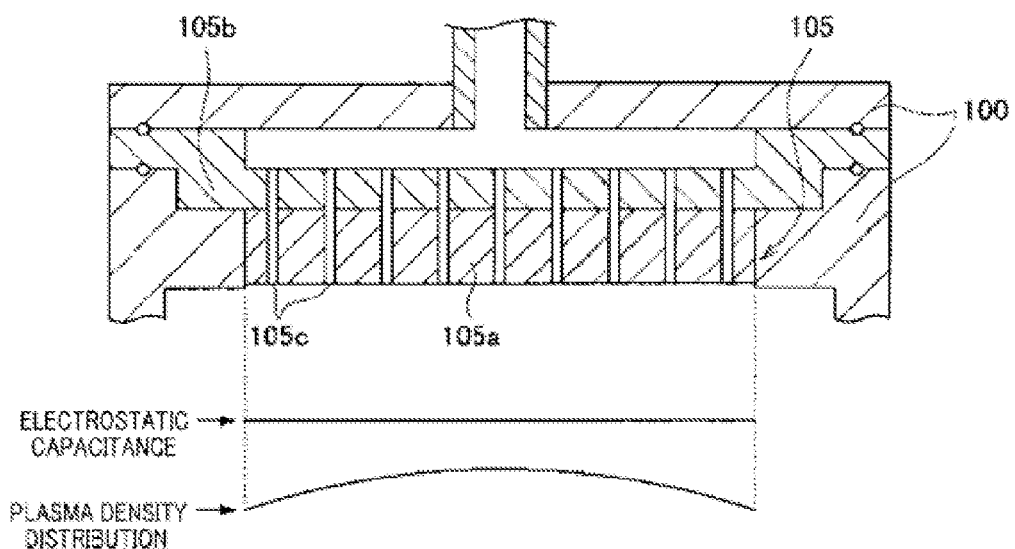
FIG. 2A is a longitudinal cross sectional view of a typical upper electrode and FIG. 2B is a longitudinal cross sectional view of an electrode in accordance with the embodiment of the present disclosure.

Hereinafter, a structure of an electrode installed in the RIE plasma etching apparatus 10 in accordance with the present embodiment will be explained in detail. FIG. 2A is a longitudinal cross sectional view of a typical upper electrode, and FIG. 2B is a longitudinal cross sectional view of the above-described upper electrode 105 in accordance with the present embodiment.

(Fine Hole of Upper Electrode and Control of High Frequency Electric Field Intensity)

Figure 6:
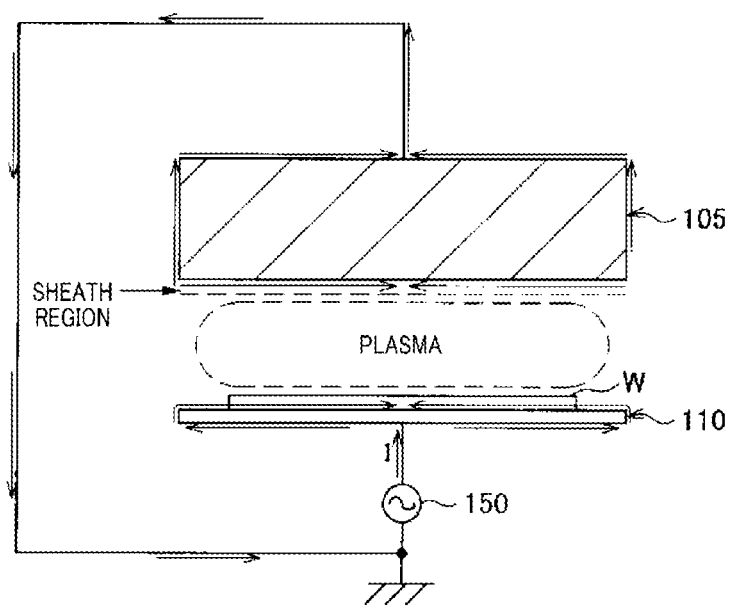
FIG. 6 is a diagram for explaining a high frequency current applied to a typical plasma apparatus.

As depicted in FIG. 6, as a frequency of the power supplied from the high frequency power supply 150 becomes higher, a high frequency current flows along a surface of the lower electrode 110 and particularly, along a top surface of the lower electrode 110 from an edge area toward a central area by a skin effect. Accordingly, electric field intensity at the central area of the lower electrode 110 becomes higher than electric field intensity at the edge area of the lower electrode 110, so that ionization or dissociation of a gas is accelerated at the central area of the lower electrode 110. Consequently, electron density of plasma at the central area of the lower electrode 110 becomes higher than electron density of plasma at the edge area thereof. Accordingly, resistivity of plasma may become low at the central area of the lower electrode 110 as compared to the edge area thereof, and, thus, the high frequency current is concentrated at the central area of the upper electrode 105 and plasma density becomes more non-uniform. FIG. 2A shows a state in which a distribution of plasma density is high at a central area of a plasma generation space and is low at an edge area thereof. Further, a distribution of capacitance (electrostatic capacitance) may be uniform since the upper base 105a made of a dielectric material may be flat.

On the contrary, in the upper electrode 105 in accordance with the present embodiment depicted in FIG. 2B, a multiple number of fine holes A may be formed on a top surface of the upper base 105a as described above. The multiple number of fine holes A may communicate with the processing chamber 100. That is, generally, a gap may be formed between the upper base 105a and the base plate 105b during a machining process. For this reason, an inner space of the processing chamber 100 may communicate with an inner space of each of the fine holes A. Therefore, if the inside of the processing chamber 100 is exhausted to be in a vacuum state by the exhaust device 175 in order to perform a plasma process, the inside of the fine hole A may also be in a vacuum state through the gap. Therefore, the vacuum space within the fine hole A may be regarded as a dielectric layer having a dielectric constant $\in_0$ of about "1".

Figure 4:
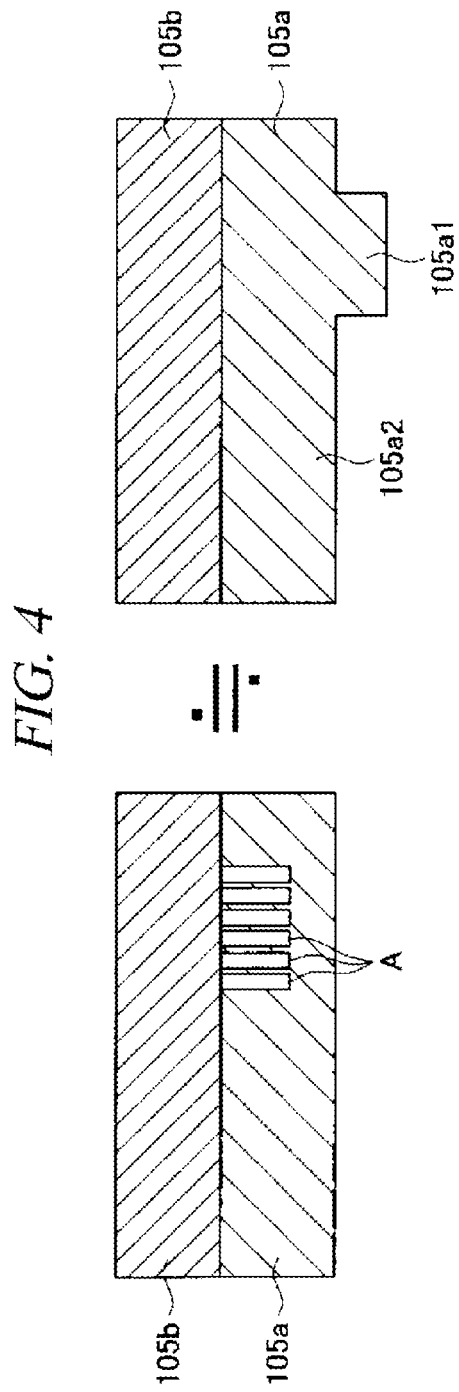
FIG. 4 is a diagram for explaining a function of a fine hole formed in an electrode in accordance with the embodiment of the present disclosure.

As described above, the upper base 105a is made of quartz having a dielectric constant $\in$ of about "3.8". Therefore, there may be made a difference in a dielectric constant between the upper base 105a and the fine hole A. Here, the dielectric constant $\in_0$ of the vacuum space is the lowest among dielectric materials. Therefore, the dielectric $\in_0$ within the fine hole A is surely lower than the dielectric constant $\in$ of the upper base 105a. Accordingly, a capacitance within the fine hole A is surely lower than a capacitance of the upper base 105a. In terms of an electrostatic capacitance, an area where fine holes A are formed as depicted in the left of FIG. 4 has an effect equal to a case in which a dielectric member serving as the upper base 105a becomes thick as depicted in the right of FIG. 4 as a protruding portion 105a1. That is, if fine holes A having a vacuum state therein are formed in the upper base 105a, it is possible to obtain an effect equal to a case in which a capacitance of the protruding portion 105a1 of the upper base 105a depicted in the right of FIG. 4 is connected with a capacitance of a flat portion 105a2 thereof in parallel.

Based on this principle, in the present embodiment, by forming the multiple number of fine holes A at the central area of the upper base 105a, an electrostatic capacitance at the central area of the upper base 105a may be reduced to be lower than an electrostatic capacitance at a periphery thereof. Accordingly, it is possible to achieve an effect equal to a case in which the dielectric member serving as the upper base 105a becomes thicker at the central area than the periphery thereof. Consequently, in the present embodiment, plasma density at the central area of the upper base 105a can be reduced, so that a density distribution of plasma can be uniform.

In the present embodiment, depths of the fine holes A may be varied such that the multiple number of fine holes A may not penetrate the upper base 105a from the top to the bottom on the side of the plasma generation space. To be specific, the multiple number of fine holes A may be formed at the central area to have a great depth and at the periphery to have a small depth, so that the multiple number of fine holes A may be formed to have a taper shape when viewed as whole. Here, the top surface of the upper base 105a serves as a bottom surface of the taper shape. Accordingly, as depicted in FIG. 2B, a distribution of electrostatic capacitance at the central area within the upper base 105a can be gradually changed so as to be lower than a distribution of electrostatic capacitance at the periphery thereof, so that a distribution of plasma density can be further uniform.

A depth of each fine hole A is not limited to the example of the present embodiment. Desirably, a depth of each fine hole A may be adjusted such that the fine hole A at a high plasma density area may be formed to have a great depth and the fine hole at a low plasma density may be formed to have a small depth. A distribution of plasma density may have different characteristics depending on a process, or an apparatus. In accordance with the present embodiment, it is possible to manufacture the upper electrode 105 appropriate for each process or each apparatus by adjusting a depth of each fine hole A by a machining process.

The fine hole A may not penetrate the upper base 105a from the top to the bottom on the side of the plasma generation space and may be physically isolated from the plasma generation space. Accordingly, it may be possible to prevent ions in the plasma from being introduced into the fine hole A, and, thus, it may be possible to avoid a generation of abnormal electric discharge within the fine hole A.

The fine hole A may be a micro hole having a diameter equal to or less than twice a thickness of a sheath. Herein, "width of a plasma sheath (s)" may be represented by the following equation 1.

$$s = \frac{4}{3}\left(\frac{z \cdot \varepsilon_0^2}{e \cdot kTe}\right)^{\frac{1}{4}} \cdot \frac{V^{\frac{3}{4}}}{n_i^{\frac{1}{2}}}$$

[Equation 1]

ρ: Width of sheath in case of a DC sheath
$\in_0$: Dielectric constant in a vacuum state
R: Boltzmann constant
$T_e$: Electron temperature
V: Sheath potential
$n_i$: Ion density Generally, unless a special machining process is performed, a gas passing through the gas passages 105d and the gas inlet lines 105e is introduced into the fine hole A. Therefore, if the inner space of the fine hole A is not filled with a sheath, the gas within the fine hole A may be excited by energy of a high frequency power and an abnormal electric discharge may be generated within the fine hole A. However, in the present embodiment, the diameter of the fine hole A is set to be equal to or less than twice the thickness of the sheath. Therefore, the inner space of the fine hole A may become a sheath region. Consequently, it may be possible to avoid a generation of abnormal electric discharge within the fine hole A and possible to prevent plasma from being introduced into the fine hole A.

A distribution of electrostatic capacitance within the upper base 105a may be changed by changing the diameter of the fine hole A within a range of twice the thickness of the sheath. By way of example, the fine holes A formed at the central area of the upper base 105a may have the same diameter and the fine holes A formed at the periphery of the upper base 105a may have a diameter smaller than the diameter of the fine holes A formed at the central area of the upper base 105a. Even if the fine holes A have the same depth, it may be possible to obtain an effect of the taper-shaped fine holes A depicted in FIG. 2B by changing the diameters of the fine holes A. Therefore, a distribution of plasma density can be uniform. Alternatively, both the depths of the fine holes A and the diameters of the fine holes A may be adjusted.

(Method of Installing an Electrode)

Figure 5:
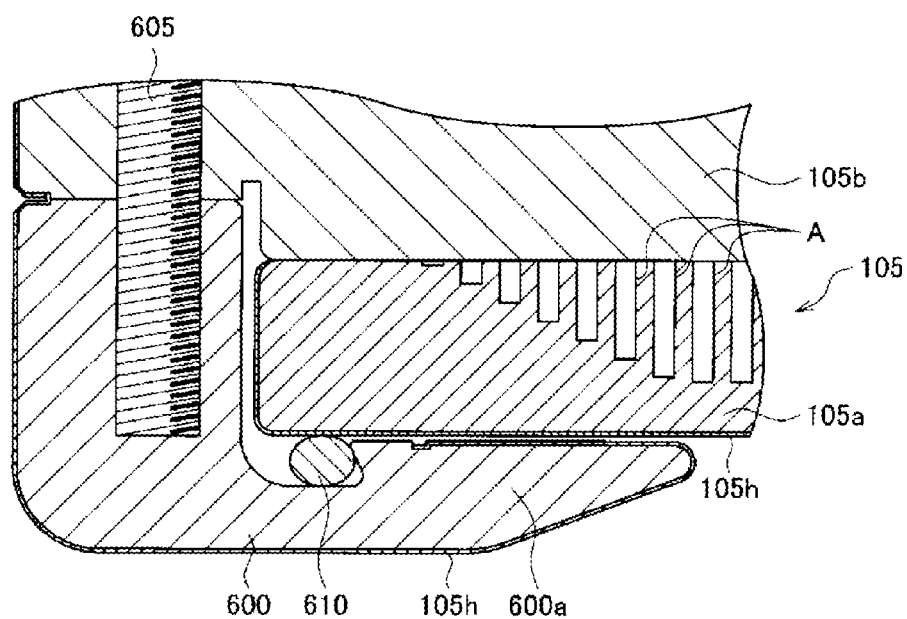
FIG. 5 is a longitudinal cross sectional view showing a vicinity of a clamp for fixing a base at an outer peripheral surface of the base.

Finally, an example method for installing the upper electrode 105 will be explained with reference to FIG. 5. FIG. 5 is a longitudinal cross sectional view showing a clamp 600 for fixing the upper electrode 105 at an outer periphery of the upper electrode 105 and a vicinity thereof.

In the present embodiment, a conductive L-shaped clamp 600 may be installed at an outer periphery of the upper base 105a. The upper electrode 105 may be tightly fixed to the base plate 105b using a screw 605 that fixes the base plate 105b and the clamp 600 and a resilience force of a spring ring 610 provided between the upper base 105a and the clamp 600. Accordingly, the upper electrode 105 may be supported at a lower outer periphery of the upper base 105a by a claw 600a of the clamp 600.

A thermally sprayed layer 105h may be formed on a surface of the upper base 105a by spraying yttria or the like to the surface. The thermally sprayed layer 105h may also be formed on a surface of the clamp 600 by thermally spraying yttria or the like to the surface.

As described above, in accordance with the upper electrode 105 and the RIE plasma etching apparatus 10 using the upper electrode 105 of the present embodiment, since a vacuum space is regarded as a dielectric layer having the dielectric constant $\in_0$ of about "1", there may be made a difference between the dielectric constant $\in$ of the upper base 105a and the dielectric constant $\in_0$ of the vacuum space within the fine hole A. Here, the dielectric constant $\in_0$ of the vacuum space may be the lowest among dielectric constants of dielectric materials. Therefore, the dielectric constant $\in_0$ within the fine hole A may be lower than the dielectric constant $\in$ of the upper base 105a. Accordingly, a capacitance (electrostatic capacitance) within the fine hole A may be lower than a capacitance of the upper base 105a.

With this principle, in the present embodiment, by forming the multiple number of fine holes A at the central area of the upper base 105a, an electrostatic capacitance at the central area of the upper base 105a may be reduced to be lower than an electrostatic capacitance at the periphery thereof. Accordingly, it is possible to achieve an effect equal to a case in which the dielectric member serving as the upper base 105a becomes thicker at the central area than the periphery thereof. Consequently, in the present embodiment, with the upper electrode 105 made of a homogeneous material, plasma density at the central area of the upper base 105a can be reduced, so that the plasma density can be uniform.

The various embodiments have been described with reference to the accompanying drawings, but the present disclosure is not limited thereto. It would be understood by those skilled in the art that all modifications and embodiments conceived from the meaning and scope of the claims and their equivalents are included in the scope of the present disclosure.

By way of example, in the above-described embodiment, the upper electrode is referred to as a first electrode and the lower electrode is referred to as a second electrode, but the present disclosure is not limited thereto. By way of example, the lower electrode can be referred to as a first electrode and the upper electrode can be referred to as a second electrode. In this case, the fine holes A can be formed in the lower electrode and can be formed on both the upper electrode and the lower electrode.

Further, in the above-described embodiment, the high frequency power for plasma excitation has been applied to the lower electrode, but the present disclosure is not limited thereto. By way of example, the high frequency power for plasma excitation can be applied to any one of the upper electrode and the lower electrode or to both the upper electrode and the lower electrode.

The plasma processing apparatus in accordance with the present disclosure is not limited to a parallel plate type plasma processing apparatus. The plasma apparatus in accordance with the present disclosure may be used for any one of an inductively coupled plasma processing apparatus, a microwave plasma processing apparatus and other plasma processing apparatuses in addition to a capacitively coupled (parallel plate type) plasma processing apparatus.

Further, in the above-described embodiment, the plasma processing apparatus has been limited to the plasma etching apparatus. However, the present disclosure is not limited thereto. By way of example, the present disclosure may be applied to a film forming apparatus or an ashing apparatus in which plasma is excited to perform a plasma process on a processing target object.

The processing target object may be a silicon wafer or a substrate.

What is claimed is:

1. An electrode of a plasma processing apparatus that introduces a processing gas into a depressurizable processing chamber, generates plasma by a high frequency power, and performs a plasma process on a processing target object by the plasma, the electrode comprising:
a base made of a dielectric material, the base being disposed in the processing chamber,
wherein a plurality of fine holes having a diameter equal to or less than twice a thickness of a sheath are formed in the base,
the plurality of fine holes communicates with an inner space of the processing chamber, and
the plurality of fine holes is isolated from a plasma generation space that is disposed within the inner space of the processing chamber, without penetrating the base from the top to the bottom thereof, thereby suppressing ions in the plasma from being introduced into the plurality of fine holes.

2. The electrode of claim 1, wherein if an inside of the processing chamber is in a vacuum state, the plurality of fine holes is in a vacuum state accordingly.

3. The electrode of claim 1, wherein depths of the plurality of fine holes are varied such that the plurality of fine holes do not penetrate the base from the top to the bottom on the side of a plasma generation space.

4. The electrode of claim 3, wherein a depth of the fine hole formed at an edge area of the base is shallower than a depth of the fine hole formed at a central area of the base.

5. The electrode of claim 4, wherein the plurality of fine holes are formed into a taper shape when viewed as whole.

6. The electrode of claim 1, wherein the plurality of fine holes are formed to have various diameters within a range of twice the thickness of the sheath.

7. The electrode of claim 6, wherein a diameter of the fine hole formed at an edge area of the base is smaller than a diameter of the fine hole formed at a central area of the base.

8. The electrode of claim 1, wherein the plurality of fine holes are uniformly provided.

9. A plasma processing apparatus comprising:
a processing chamber configured to perform a plasma process on a processing target object;
first and second electrodes arranged to face each other in the processing chamber and configured to form a processing space therebetween; and
a high frequency power supply connected with at least one of the first and second electrodes and configured to output a high frequency power into the processing chamber, wherein the first electrode includes a base made of a dielectric material the base being disposed in the processing chamber,
a plurality of fine holes having a diameter equal to or less than twice a thickness of a sheath are formed in the base,
the plurality of fine holes communicates with an inner space of the processing chamber, and the plurality of fine holes is isolated from a plasma generation space that is disposed within the inner space of the processing chamber, without penetrating the base from the top to the bottom thereof, thereby suppressing ions in the plasma from being introduced into the plurality of fine holes
wherein the first electrode is an upper electrode, and the upper electrode is provided with a plurality of gas inlet lines and serves as a shower head.

10. The plasma processing apparatus of claim 9, wherein the second electrode is a lower electrode, and the high frequency power supply is configured to supply the high frequency power to the lower electrode.

\* \* \* \* \*